США007742539B2

(12) United States Patent
Fonden et al.

(10) Patent No.: US 7,742,539 B2
(45) Date of Patent: Jun. 22, 2010

(54) ADAPTATION OF IQ-ERROR COMPENSATION

(75) Inventors: Tony Fonden, Spanga (SE); Mats Klingberg, Enskede (SE)

(73) Assignee: Telefonaktiebolaget L M Ericsson (publ), Stockholm (SE)

(*) Notice: Subject to any disclaimer, the term of this patent is extended or adjusted under 35 U.S.C. 154(b) by 818 days.

(21) Appl. No.: 11/568,694

(22) PCT Filed: May 17, 2005

(86) PCT No.: PCT/SE2005/000717

§ 371 (c)(1),
(2), (4) Date: Nov. 3, 2006

(87) PCT Pub. No.: WO2005/112254

PCT Pub. Date: Nov. 24, 2005

(65) Prior Publication Data

US 2007/0165745 A1 Jul. 19, 2007

(30) Foreign Application Priority Data

May 19, 2004 (WO) ............... PCT/SE2004/000789

(51) Int. Cl.
*H04L 25/49* (2006.01)

(52) U.S. Cl. ............... 375/296; 375/269; 375/297; 375/295

(58) Field of Classification Search ............ 375/297, 375/269

See application file for complete search history.

(56) References Cited

U.S. PATENT DOCUMENTS

| 6,104,239 | A | * | 8/2000 | Jenkins | 330/2 |
|---|---|---|---|---|---|
| 7,085,330 | B1 | * | 8/2006 | Shirali | 375/296 |
| 7,215,716 | B1 | * | 5/2007 | Smith | 375/296 |
| 7,403,573 | B2 | * | 7/2008 | DeBruyn et al. | 375/297 |
| 7,415,250 | B2 | * | 8/2008 | Sasaki et al. | 455/114.2 |
| 2002/0034260 | A1 | * | 3/2002 | Kim | 375/296 |
| 2002/0181611 | A1 | * | 12/2002 | Kim | 375/296 |
| 2004/0057533 | A1 | | 3/2004 | Kermalli | |

FOREIGN PATENT DOCUMENTS

| WO | WO 0217586 A1 | 2/2002 |
|---|---|---|
| WO | WO 03017466 A2 | 2/2003 |

* cited by examiner

*Primary Examiner*—Shuwang Liu
*Assistant Examiner*—Kenneth Lam
(74) *Attorney, Agent, or Firm*—Roger S. Burleigh (57) ABSTRACT

A radio transmitter with IQ-modulator error compensation includes a homodyne observation receiver (42) producing a first real baseband (S5) signal from a real radio frequency signal (S2). A real-value extracting element (44) and a down-sampler (46) convert a complex baseband signal (S1) into a second real baseband signal. An adapter (40) determines parameters controlling an IQ-error compensator (12) by minimizing the error between the two real baseband signals. In a preferred embodiment he transmitter also includes a phase shifter (56) providing three different phase shifts to compensate for the fact that the homodyne observation receiver produces a real and not a complex signal.

9 Claims, 9 Drawing Sheets

ADAPTATION OF IQ-ERROR COMPENSATION

TECHNICAL FIELD

The present invention relates generally to error compensation in radio transmitters and radio receivers, and especially to IQ-modulator and IQ-demodulator error compensation (I=inphase, Q=quadrature phase).

BACKGROUND

The up-conversion from baseband to radio frequency (RF) in radio transmitters can be performed as a single step "direct conversion" using an analog IQ-modulator architecture or as a multiple step "digital intermediate frequency" conversion using both digital and analog mixers. Generally the IQ-modulator architecture is preferable, since it gives better performance and is less complex. However, this also requires a simple and effective way of correcting for the so-called IQ-errors generated by the IQ-modulator.

Conventionally the IQ-errors are compensated in an IQ-error compensator, the parameters of which are determined by an adapter using the baseband signal and a signal from a so-called observation receiver. This observation receiver converts the radio frequency (RF) signal from the power amplifier to baseband in two steps. In the first step an analog mixer converts it to intermediate frequency, where it is digitized. The digitized intermediate frequency signal is then digitally converted to an IQ-signal at baseband by a digital mixer. A drawback of the known method, however, is that several analog local oscillators have to be used, one for the IQ-modulator and one for the observation receiver. In addition to the increased costs, this approach leads to a complicated cancellation of the phase noise of the transmitter and observation receiver local oscillators. There is also a risk for leakage from the observation receiver local oscillator.

SUMMARY

An object of the present invention is to reduce the number of local oscillators in a transmitter or receiver using an observation receiver for IQ-error compensation.

This object is achieved in accordance with the attached claims.

Briefly, the present invention is based on the insight that it is in fact possible to use the same analog local oscillator for both IQ-modulator and observation receiver, provided that the observation receiver is a real homodyne observation receiver and that further RF-signal processing is introduced to obtain enough information to determine the compensator parameters.

BRIEF DESCRIPTION OF THE DRAWINGS

The invention, together with further objects and advantages thereof, may best be understood by making reference to the following description taken together with the accompanying drawings, in which.

DETAILED DESCRIPTION

In the following description the same reference designations will be used for elements having the same or similar functions.

In a radio transmitter the signal is often generated by digital signal processing at baseband and then transformed to an analog RF signal. In the "direct conversion" transmitter the real (I) and imaginary (Q) parts of the baseband signal are converted to analog by two separate digital-to-analog converters (DACs). The output signals from the DACs are transposed to RF by two separate RF mixers, and the two RF mixer outputs are summed together to form the final RF signal. The radio frequency local oscillator signals to the two mixers are to be in quadrature phase, and therefore this arrangement is also called an analog "IQ" ("in phase" and "quadrature phase") modulator.

The analogue IQ-architecture has several important advantages over the digital IF architecture mentioned above. The filtering and local oscillator signal generation is normally simpler and the lower number of involved frequencies means lower risk for spurious signals. Above all, the IQ-modulator architecture gives (for the same type of DACs) the double bandwidth as compared to the digital IF architecture (Actually, due to the simpler filtering in the IQ architecture the bandwidth is often significantly more than doubled, due to the fact that less bandwidth has to be "wasted" as "guard bands"). The IQ-modulator, however, has the problem of IQ-modulator errors. The most important IQ-errors (or "non-idealities") are carrier leakage, that the gains for the two signal paths are not exactly equal and that the total phase difference is not exactly equal to a quarter of an RF cycle.

The IQ-errors can be compensated in the digital domain by some additional digital signal processing. This is not difficult, provided that the IQ-errors are known, in sufficiently accurate quantitative detail. In other words, if the non-ideal IQ-modulator is described by a model, the problem consists of knowing the values of the model parameters. Then it is easy to implement the "inverse IQ-error" ("IQ-compensation") in the digital signal processing. Due to production spread, and drift due to temperature, ageing, moisture, etc., the IQ-modulator parameters are changing and never known a-priori. The standard solution is then to have an adaptive IQ-error compensation. The output signal is monitored by an "observation receiver" and the IQ-compensator parameters are adjusted for maximum output signal quality.

The principle of adaptive correction for non-idealities in a radio transmitter is not limited to an IQ-modulator. In particular it is difficult to make the high-power RF-amplifier of a transmitter sufficiently linear by itself. Therefore, an adaptive correction for the RF power amplifier non-linearities is often done along the same principles as for the IQ-modulator (generally called "adaptive pre-distortion linearization"). In a radio transmitter it is generally preferred to have a single observation receiver for the transmitter from which one can adapt all the compensators (IQ-error compensator, RF power amplifier pre-distorter, and possibly more).

Figure 1:
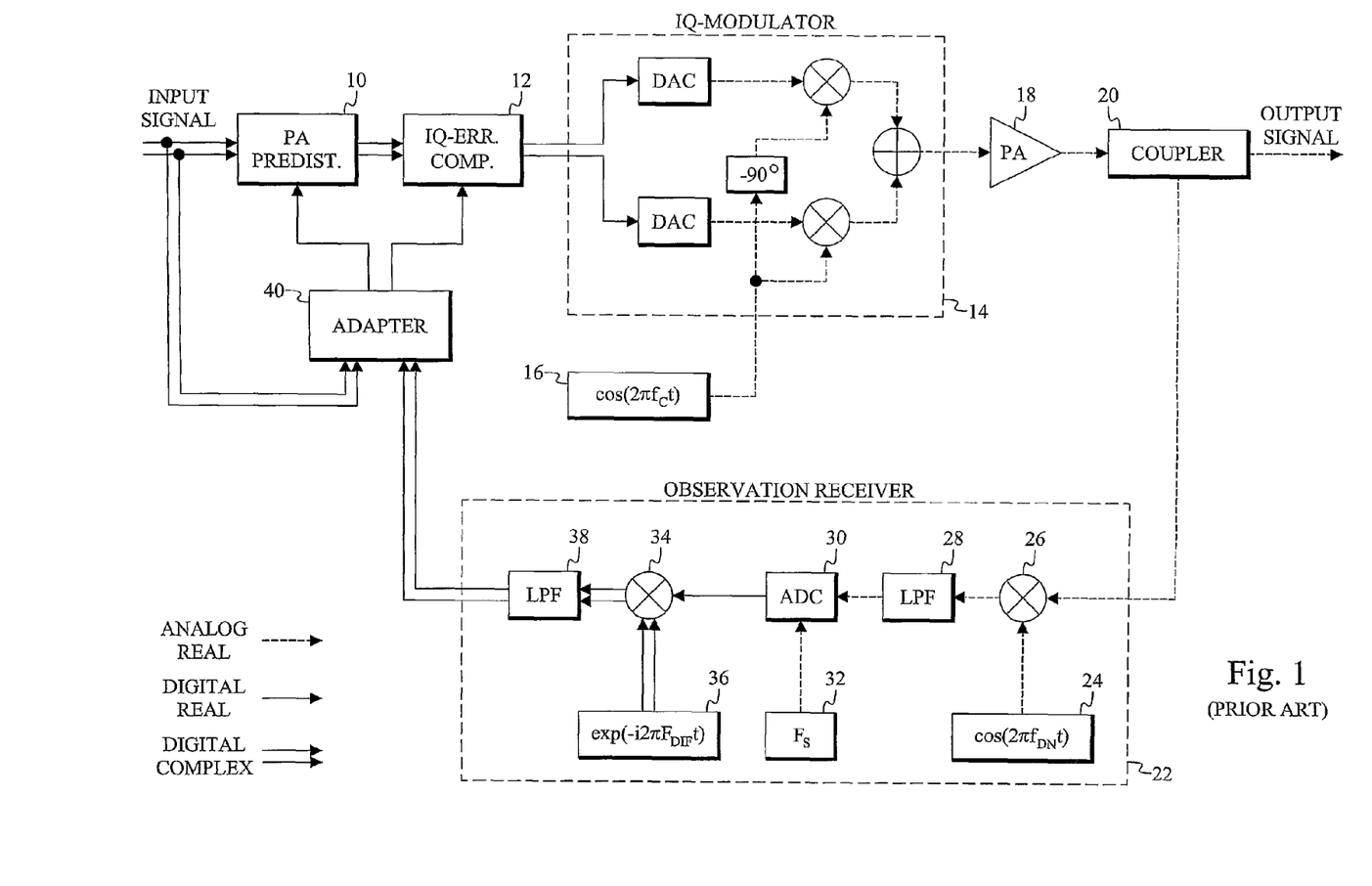
FIG. 1 is a block diagram of a conventional IQ-modulator error compensated transmitter.

FIG. 1 is a block diagram of a typical conventional IQ-modulator error compensation system. In this and the following figures analog real signals are represented by dashed lines, real digital signals are represented by solid lines and complex signals are represented by solid double lines. As indicated in the lower left part of FIG. 1, a complex digital baseband signal is forwarded to a power amplifier (PA) pre-distorter 10, which pre-distorts the signal to counteract distortion produced by a radio frequency PA 18. The complex digital output signal of pre-distorter 10 is forwarded to an IQ-error compensator 12, which compensates for errors generated by an IQ-modulator 14, which transforms the complex digital baseband signal into a real-valued analog RF-signal at carrier frequency $f_c$, which is amplified by PA 18. The carrier signal is obtained from a local oscillator 16.

A coupler 20 takes a small part of the real analog RF-signal from PA 18 to an observation receiver 22. The input signal to observation receiver 22 is forwarded to an analog mixer 26, in which it is multiplied by $\cos(2\pi f_{DN}t)$ from a local oscillator 24. The real analog output signal from mixer 26 is filtered in a low-pass filter 28, and the resulting real analog intermediate frequency signal is A/D converted in an A/D converter (ADC) 30 at a sampling rate $F_s$ provided by a clock 32. The resulting real digital signal is down-converted to a complex digital baseband signal in a digital mixer 34 using a complex signal $\exp(-i2\pi F_{DIF}t)$ from an oscillator 36. Here it is assumed that $F_{DIF} = f_c - f_{DN}$. The resulting complex digital signal is filtered in a low-pass filter 38 to form a down-converted complex digital baseband signal. If all components of the system are ideal, then the original baseband signal and the down-converted signal should be identical (up to a proportionality factor and a time-delay of the loop). Since these signals typically are not equal, due to distortion produced in IQ-modulator 14 and power amplifier 18, the two signals are compared in an adapter 40, the purpose of which is to adjust the parameters of pre-distorter 10 and IQ-error compensator 12 to make the signals as equal as possible.

A drawback of the conventional IQ-modulator error compensation system is that it requires two analog local oscillators 16, 24 operating at different frequencies $f_c$ and $f_{DN}$, respectively. First of all this leads to high costs for oscillator components. Secondly, it is complicated to cancel the phase noise of the local oscillators of the transmitter and observation receiver. There is also a risk for leakage from the observation receiver oscillator.

As noted in the previous paragraph the use of two analog local oscillators of the prior art system has several drawbacks. It would be desirable to eliminate these drawbacks by using a single analog oscillator for both up-conversion in the transmitter and down-conversion in the observation receiver. The obvious solution would be to use an analog IQ-demodulator driven by the same local oscillator as the IQ-modulator. This would work nicely if an ideal IQ-demodulator could be used. In practice, however, an IQ-demodulator has the same types of non-idealities as an IQ-modulator. Thus, it would in practice not be possible to determine the IQ-errors of the transmitter alone, but only the combined errors of the IQ-modulator of the transmitter and the IQ-demodulator of the observation receiver. In accordance with the present invention, instead of using an IQ-demodulator, it is suggested to use a homodyne observation receiver. The homodyne observation receiver transposes the analog real RF signal down to a real baseband signal in a single down-conversion using the same local oscillator as the IQ-modulator. It is true that also such a homodyne observation receiver generates errors, but these can be determined separately from the IQ-modulator errors, as will be shown below. A possible reason that such a solution has not been suggested before is that a general assumption of the prior art is that the observation receiver of a transmitter with an adaptively pre-distorted RF PA and/or pre-compensated IQ-modulator has to have a digital bandwidth (e.g. Nyquist bandwidth) at least as large as the input signal bandwidth. However, as will be shown below this assumption is not correct. In fact the observation receiver may have an arbitrarily small digital bandwidth (arbitrarily small sampling rate) and an analog bandwidth (at baseband) down to half the (distorted) signal bandwidth.

Figure 2:
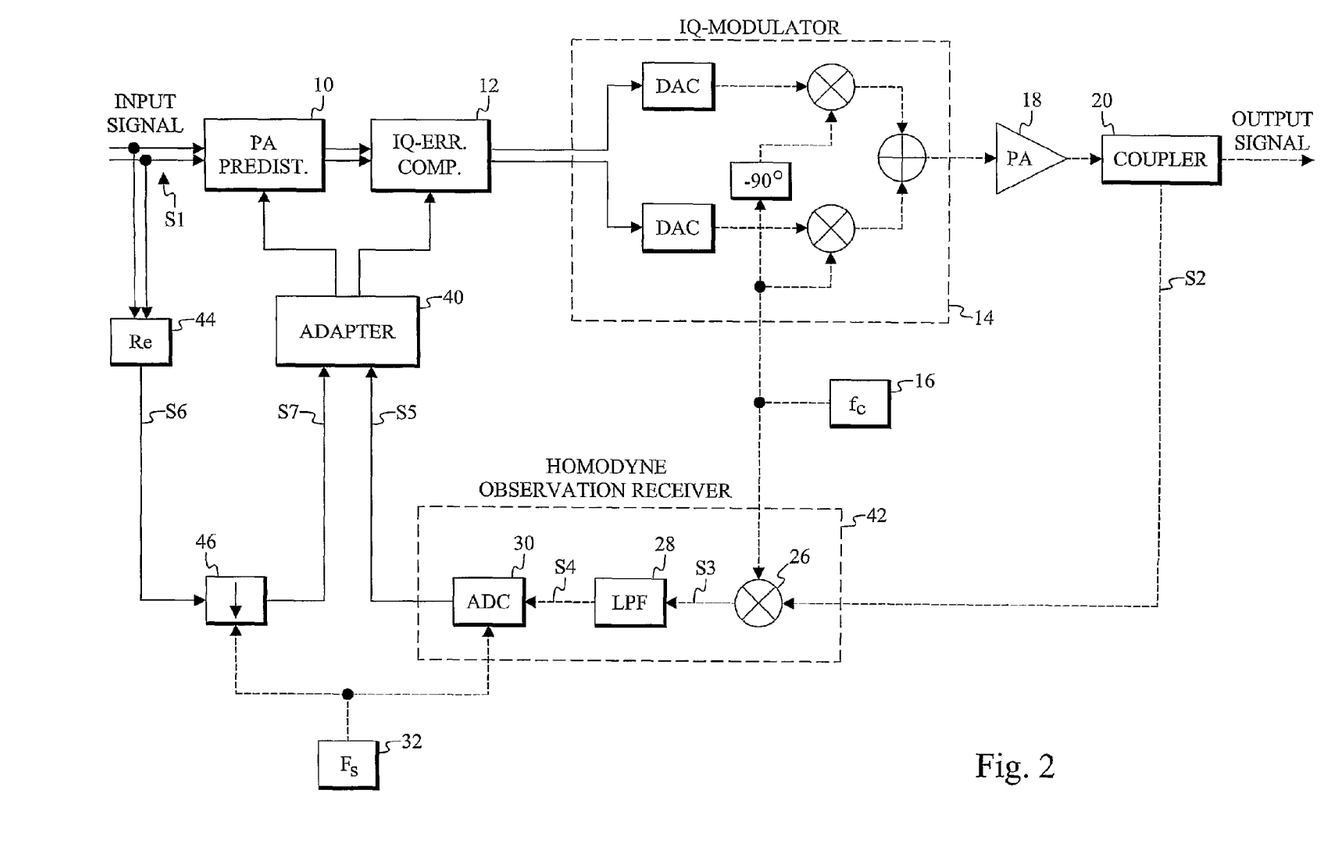
FIG. 2 is a block diagram of a first embodiment of an IQ-modulator error compensated transmitter in accordance with the present invention.

FIG. 2 is a block diagram of the basic structure of an IQ-modulator error compensation system in accordance with the present invention. The following description of this block diagram will frequently refer to the spectra of various signals in FIG. 3. As in the conventional system of FIG. 1 the complex input signal S1 is pre-distorted, IQ-error compensated, up-converted and amplified into an RF-signal, a portion S2 of which is forwarded to a homodyne observation receiver 42. In the present application a homodyne observation receiver is assumed to receive a real RF-signal and produce a real baseband signal in a single mixing step. Thus, signal S2 is mixed in a mixer 26 with the carrier signal from local oscillator 16, which also drives IQ-modulator 14, to produce an analog signal S3. The analog signal S4 is obtained after low-pass filtering in filter 28. Finally signal S4 is A/D-converted at sampling frequency $F_S$ in ADC 30 to produce the real digital signal S5, which is forwarded to adapter 40. On the input signal side, instead of forwarding signal S1 directly to adapter 40, as is done in the conventional system of FIG. 1, only the real (I) component is extracted by element 44. This real component is down-sampled in a down-sampler 46 to the same sample rate $F_S$ as signal S5. The resulting signal S7 is forwarded to adapter 40 as a reference signal. If the sample rate $F_S$ is the same as the sample from element 44, down-sampler 46 may be omitted.

Figure 3:
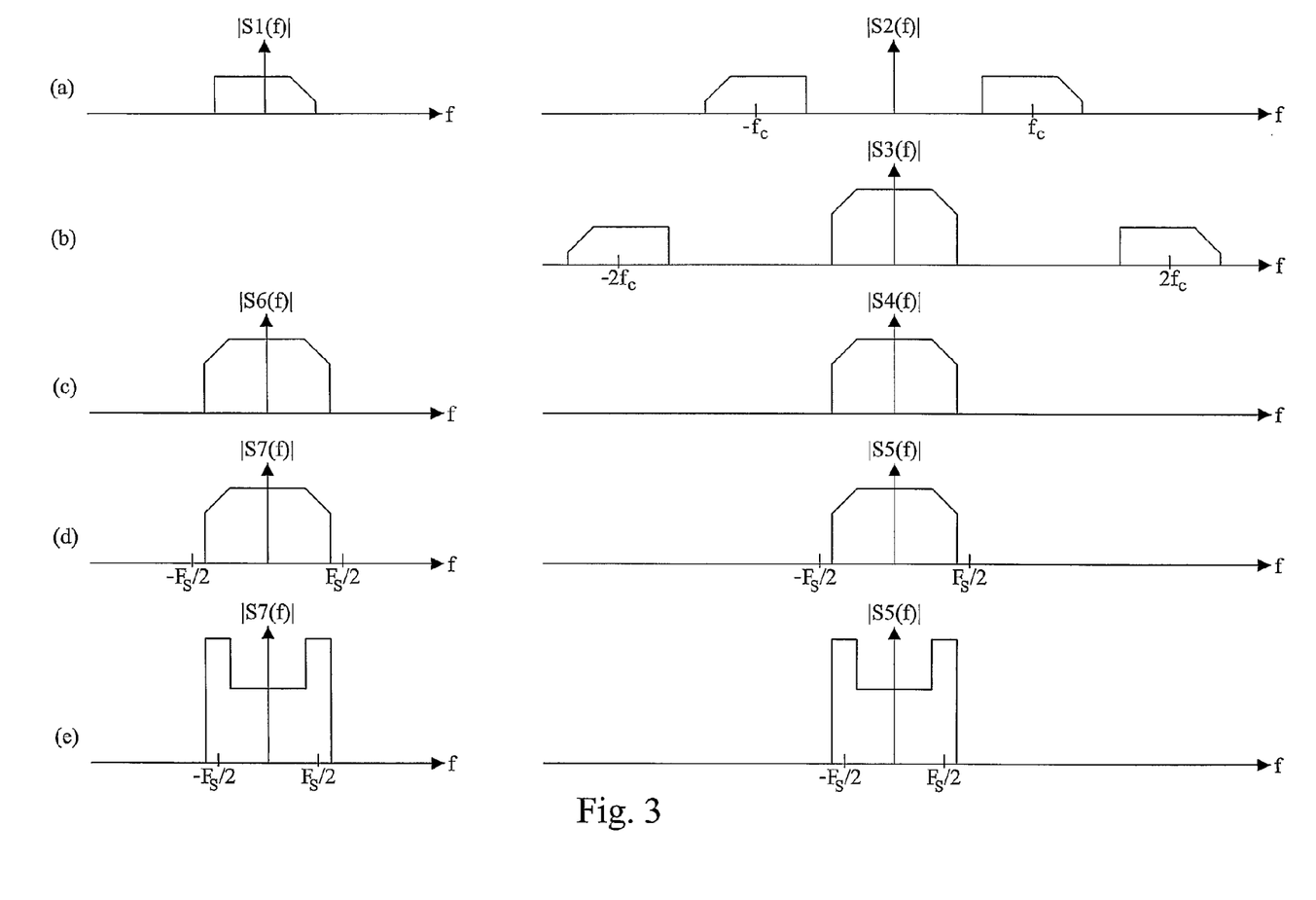
FIG. 3 illustrates the spectra of various signals of the IQ-modulator error compensated transmitter of FIG. 2.

Studying FIG. 3 (it should be noted that the plots in FIG. 3 are only sketches of the power spectra, which are not to scale), it is noted that the spectrum of signal S4 in FIG. 3(c) is distorted with respect to the spectrum of the original input signal S1 in FIG. 3(a) due to the homodyne down-conversion. However, it may also be noted in FIG. 3(c) that the spectrum of signal S6 (the real part of the input signal) is distorted in exactly the same way. The same conclusion is true for the digitized signal 5S and the down-sampled signal S7 in FIG. 3(d). Thus, although the spectra of signals S5 and S7 have been distorted, they can still be compared in adapter 40, since they have been subjected to the same distortion.

In FIG. 3(d) the sampling rate has been chosen above the Nyquist frequency to avoid aliasing. Thus, there is no further distortion from FIG. 3(c) to FIG. 3(d). However, as illustrated in FIG. 3(e) the sampling rate can be chosen below the Nyquist frequency (actually arbitrarily low), since both signals will be subjected to the same aliasing. The signals can still be compared in adapter 40.

Thus, the conclusion is that, contrary to the prevailing view, a homodyne observation receiver with an arbitrarily low sampling rate may in fact be used in an IQ-modulator error corrected transmitter, provided that the reference signal is modified into the real part of the input signal down-sampled to the same sampling rate.

Although it has been shown that the output signal S5 of the homodyne observation receiver may actually be compared to the real reference signal S7 in adapter 4 since both signals have been subjected to the same distortion, it may be argued that the information content in these signals has been reduced to such an extent that it is no longer possible to use them for adaptation of IQ-modulator error compensator 12. After all, by taking the real part of the reference signal in element 44, half of the information is discarded. This issue will now be discussed in more detail.

As noted above, an analog IQ-modulator has non-idealities (IQ-modulator errors). The two most important are a DC-shift of the input complex-valued base-band signal, and an unbalance and mixing of the real (I) and imaginary (Q) components of the input signal. The first non-ideality can equivalently be described as a carrier leakage. The latter non-ideality can equivalently be described in the frequency domain as an unbalance and mixing between corresponding upper and lower sideband frequency components. In a transmitter using the IQ-architecture, both the IQ-modulator errors and the non-linearities of the power amplifier can be compensated for in the digital complex baseband. For this to be possible, however, the output signal of the observation receiver has to contain un-ambiguous information about all the relevant non-idealities of both the IQ-modulator and the power amplifier.

The homodyne observation receiver transposes the carrier leakage down to zero frequency. Because the output of the observation receiver is real-valued, this means "taking the real part" of the complex-valued DC-shift of the IQ-modulator. The output signal of the observation receiver is independent of the imaginary part of the IQ-modulator's DC-shift, so there does not seem to be enough information to compensate for the IQ-modulator DC-shift. Furthermore, also the observation receiver is generally not ideal and contributes its own DC-shift. Thus, it does not even seem possible to determine the real part of the IQ-modulator's DC-shift. Only the sum of the DC-shifts of the observation receiver and real part of the DC-shift of the IQ-modulator seems to be available. Similarly, when the observation receiver takes the real part of the signal, no independent information about the upper and lower sideband frequency components is obtained. Therefore there does not seem to be enough information available to adapt the compensation for the I/Q unbalance and mixing errors of the transmitter. Although the discussion above primarily was directed towards DC-shifts (since they are the more difficult to determine due to the extra DC-shift in the homodyne observation receiver), similar comments apply to the IQ-unbalance.

In the discussion of the previous paragraph it is noted that the power amplifier non-linearity was ignored. It turns out that this is actually a hint towards a solution of the problem discussed there. If there is a non-linearity between the IQ-modulator and the observation receiver, then the carrier leakage signal of the IQ-modulator will mix with the information signal and form additional distortion components. Information concerning the two IQ-modulator DC-shift parameters will then reside not only in the carrier frequency signal component, but also in numerous distortion signal components. In most cases three or more independent signal components related to the DC-shifts will then remain even after "taking the real part", and the three DC-shift parameter values can be unambiguously determined.

Figure 4:
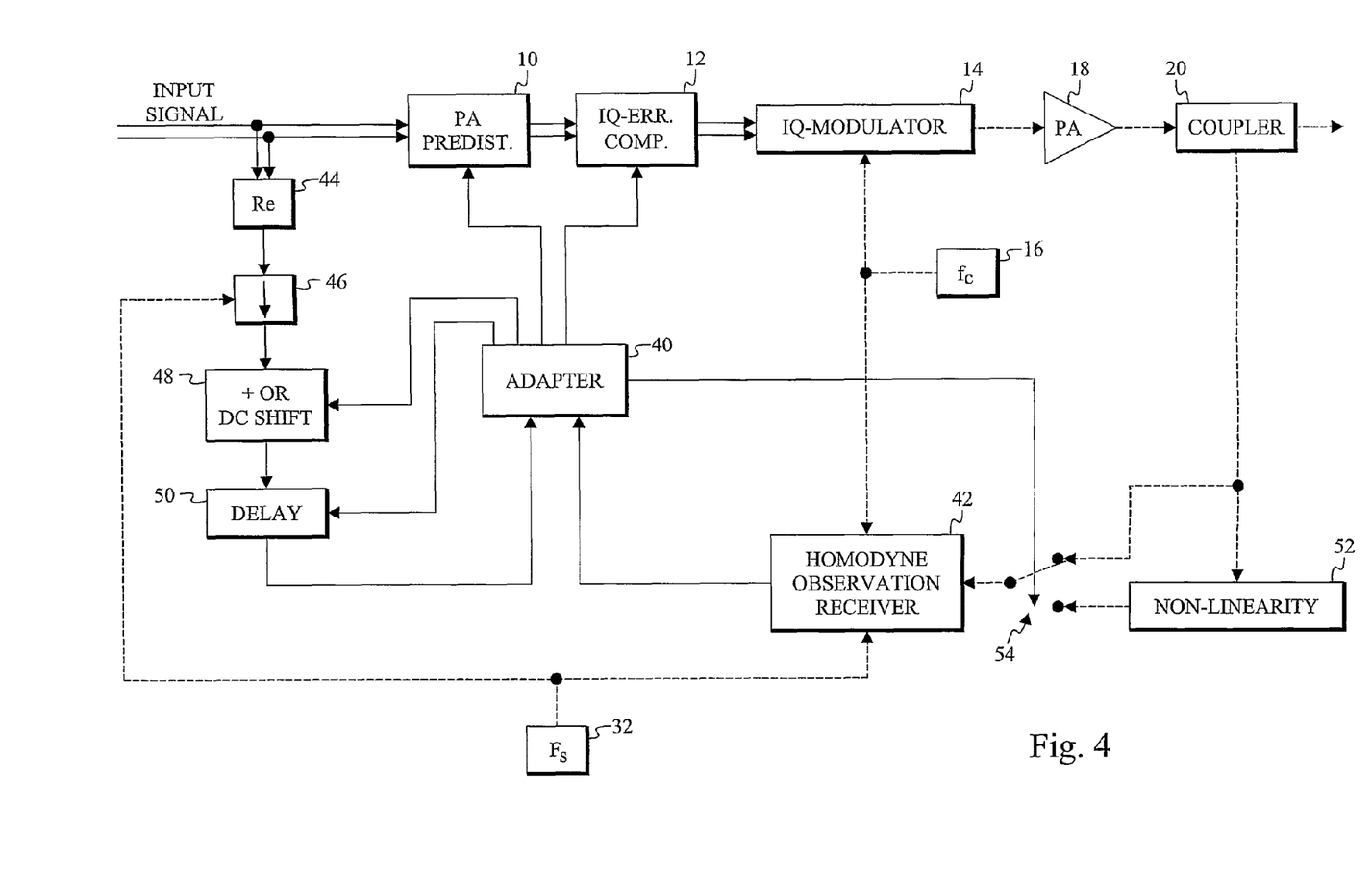
FIG. 4 is a block diagram of a second embodiment of an IQ-modulator error compensated transmitter in accordance with the present invention.

The feature described in the previous paragraph requires a sufficiently non-linear power amplifier. If this should not be the case, it is possible to intentionally add additional non-linearity in the path between the IQ-modulator and the observation receiver. An example of such an embodiment is illustrated in FIG. 4. When a switch 54 is in the upper position only the PA non-linearity itself is used. Should the distortion by the PA alone turn out to be too small to adapt the IQ-modulator, an additional non-linearity 52 is switched in and the pre-distorter and IQ-error compensator are adapted. The IQ-error compensator parameters are then frozen, and the extra non-linearity 52 is switched out to adapt the pre-distorter to its correct settings. The embodiment of FIG. 4 also includes an adder 48 that adds the determined DC-shift of the observation receiver 42 and a delay element 50 that synchronizes the input signals to adapter 40 by accounting for the delay caused by the feedback loop containing the observation receiver. As an alternative these elements my be considered as included in adapter 40. This is the view taken in the embodiment of FIG. 2, where they have not been explicitly shown.

In the embodiment of FIG. 4 pre-distorter 10 is set to wrong settings during adaptation of the IQ-parameters. Various ways to avoid this feature do exist. One possibility is to instead place the extra non-linearity in front of the PA 18. The trade-off, however, is probably a more wide-band DAC and up-converter in order to achieve the linearization. Another possibility is to adapt the parameters of a model of the IQ-modulator and PA and possibly the extra non-linearity by making the model output signal as equal as possible to the observation receiver signal. The correct IQ-error compensator and pre-distorter parameter values can then be obtained indirectly from the model.

Figure 5:
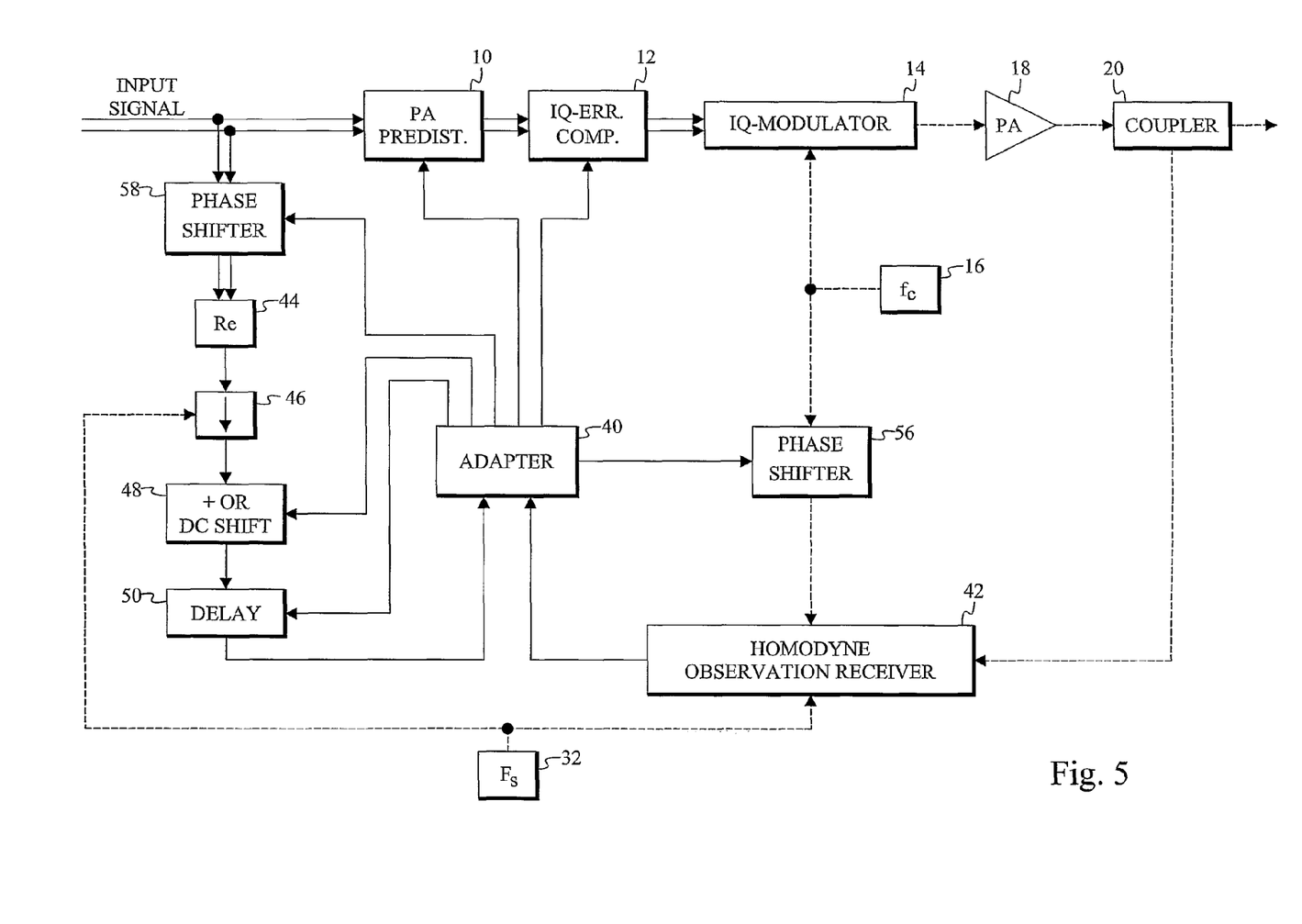
FIG. 5 is a block diagram of a third embodiment of an IQ-modulator error compensated transmitter in accordance with the present invention.

Another way to resolve the three independent variables, real and imaginary DC-shifts of the IQ-modulator and DC-shift of the observation receiver is to let the observation receiver "take the real part of" the PA output signal phase shifted by three different phase angles. In this way three different projections of the DC-shift, I/Q mix and balance error are obtained. An embodiment implementing this idea is illustrated in FIG. 5. In this embodiment a phase shifter 56 is controlled by adapter 40 to apply three different phase shifts from the local oscillator 56 to the mixer in the homodyne observation receiver. Preferably the phases are 2pi/3, 0 and −2pi/3, but other values are also possible, as long as they are sufficiently different to produce distinct I/Q mixes. As usual the adaptation works by the adapter 40 adjusting all the compensator parameters so that the two input signals to the adapter become as equal as possible. For this to work the reference input signal also has to be given the same phase-shift as the observation receiver signal, as indicated by phase shifter 58. Since the values of the observation receiver phase-shifts may be drifting in the same way as the transmitter non-idealities, the compensating phase-shift values also have to be up-dated by the adapter.

The IQ-compensator compensates for all the carrier leakage into the transmitter before the final coupler 20 that takes the signal out to the observation receiver, not just the DC-shift of the IQ-modulator. This is an additional advantage of using the same local oscillator for the observation receiver as for the transmitter. This applies, however, only to leakages from before the phase-shifter 56. Leakage from after the phase-shifter has to be kept to low enough levels by hardware. Ideally the local oscillator input to the observation receiver mixer should not leak out from its RF-input. In practice some leakage will occur. That is not a serious problem though. The leakage can, for example, be attenuated to low enough levels by an isolator in front of the mixer. This could be e.g. a circulator type of isolator or a buffer amplifier with low enough reverse gain. The potential leakage could also be attenuated by using a properly terminated directional coupler 20 in FIG. 3.

By using the same local oscillator for the observation receiver and the transmitter, the detrimental effect of the phase noise of the oscillator on the estimated parameter values cancels out. For the phase noise cancellation to be effective, the time delay from the local oscillator to the local oscillator input of the observation receiver mixer should be adjusted to equal the time delay of the path from the local oscillator through the IQ-modulator and PA to the RF input of the observation receiver mixer. This delay should normally not be so sensitive to require adaptation, a delay fixed at design should normally do.

Figure 6:
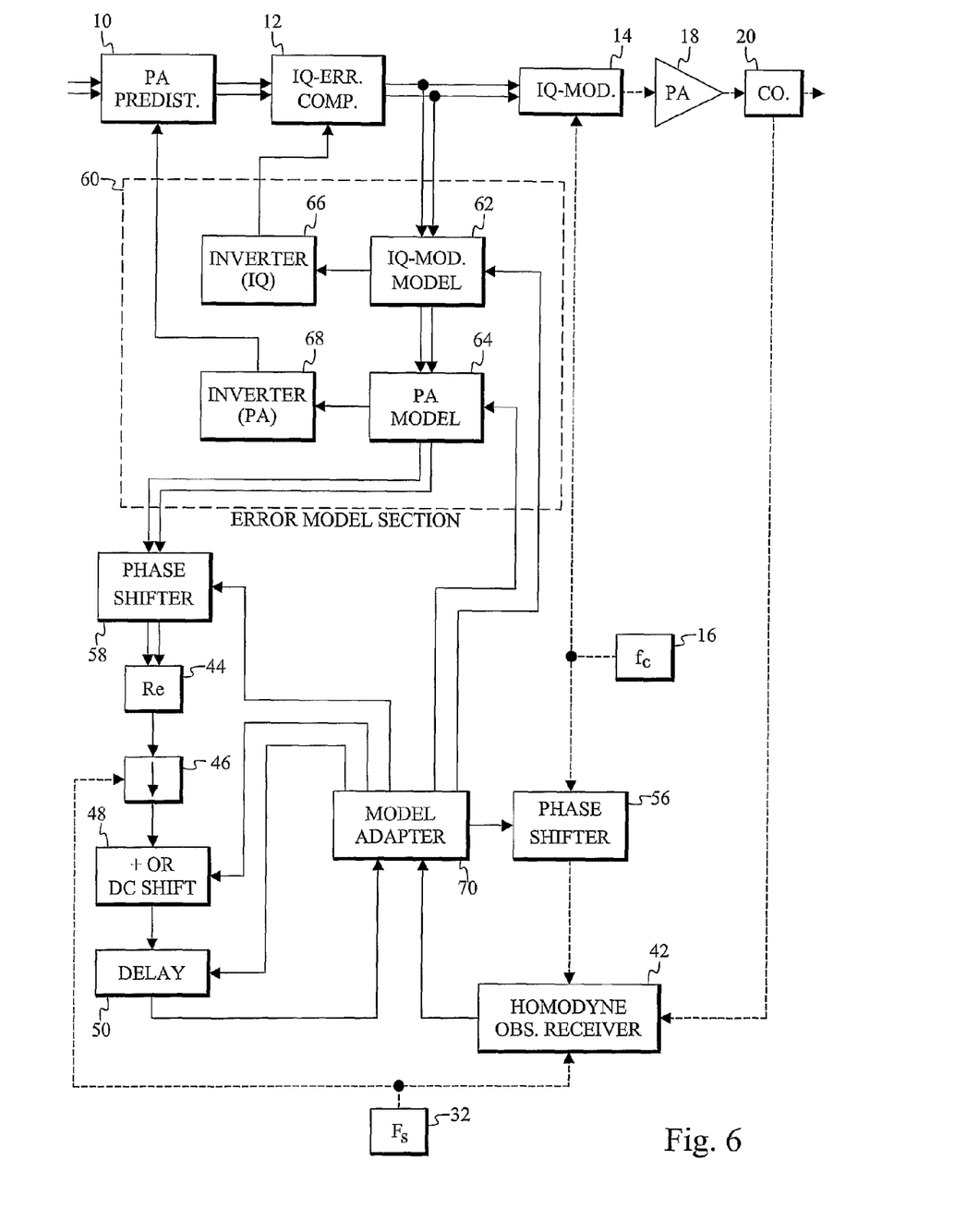
FIG. 6 is a block diagram of a fourth embodiment of an IQ-modulator error compensated transmitter in accordance with the present invention.

The adaptation of the embodiments of the present invention described so far may in some applications be considered to be too slow. The reason for a possibly slow convergence of the correction parameters is that the adapter has no a priori knowledge of what direction an iteration should have in parameter space to reduce the error. FIG. 6 illustrates an embodiment that addresses this potential problem. In FIG. 6, instead of adapting PA pre-distorter and IQ-error compensator 12 directly, models 62 and 64, respectively of these elements are adapted (in this example the models are operating at digital baseband and the reference signal is taken after pre-distorter 10 and compensator 12) in a model adapter 70. The compensation parameters are then obtained by inverting the adapted models in inverters 66 and 68. The advantage of this approach is that the models are known to the model adapter 70 (both the defining equations of the models and the values of the parameters and input signal). Thus, the model adapter can determine the gradient of the model output samples in parameter space (the partial derivatives of the model output signal with respect to the parameters). This informs the model adapter of what direction to take in parameter space in order to reduce the error, which makes the adaptation more efficient.

The principles of the adaptation in accordance with the present invention are also illustrated in the APPENDIX, which includes commented MATLAB® code that simulates the behavior of a transmitter in accordance with the present invention. The main program "test" calls several sub-programs "IQmodulator", "m1phases3", "rhdtor1", "fpol1", which simulate the behavior of IQ-modulator 14, phase shifter 56, observation receiver 42 and power amplifier 18, respectively. By adding and removing comment start symbols (%), different power amplifier models (with different non-linear behavior) may be studied by running the program "test". Similarly the phase shifter may be included or excluded.

Figure 7:
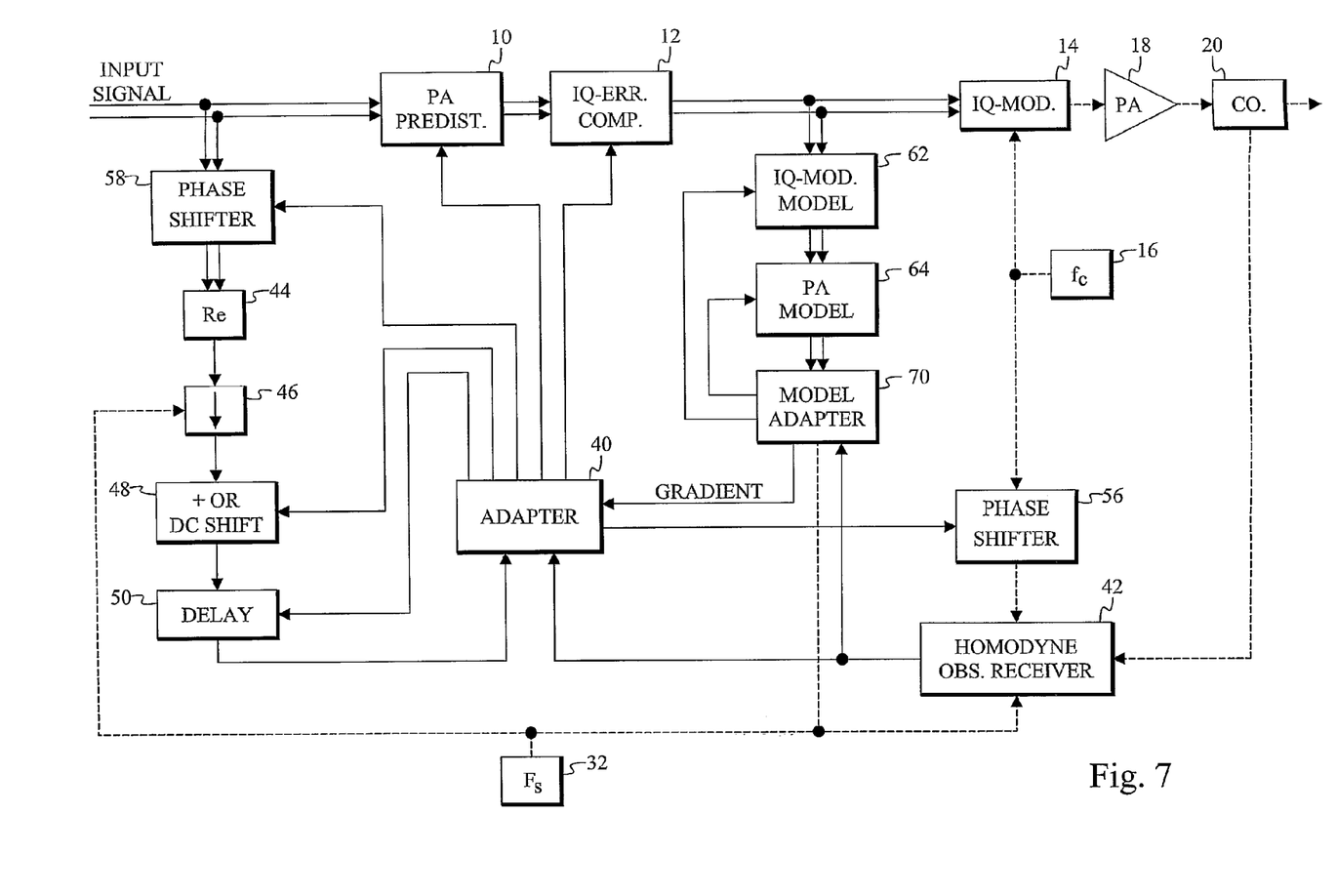
FIG. 7 is a block diagram of a fifth embodiment of an IQ-modulator error compensated transmitter in accordance with the present invention.

As noted above, an advantage of the embodiment of FIG. 6 is that it gives a faster adaptation than the other described embodiments. A potential disadvantage, however, is that it may be sensitive to modeling errors (errors in the IQ-modulator model and PA-model, and also to possible errors in the inverters). The reason is that it is an "open loop" approach, i.e. the reference signal is not the actual input signal, but a signal obtained after pre-distorter 10 and compensator 12. On the other hand, the embodiment of FIG. 5 may have slow adaptation, but it is very robust, since it is a "closed loop" implementation (the reference signal is the actual input signal). If the extra complexity is acceptable, the two embodiments may be combined to give an embodiment that is both robust and has fast adaptation. Such an embodiment is illustrated in FIG. 7. In this embodiment the IQ-modulator model 62 and PA-model 64 are not connected directly to adapter 40. Instead they are connected to a model adapter 70, which adapts the models. The purpose of this adaptation of the models is to obtain gradient estimates to help adapter 40 in the closed loop adaptation of the actual IQ-error compensation parameters and the PA pre-distortion parameters. In order to avoid cluttering of the drawing, model adapter 70 is illustrated as being directly connected to PA-model 64. However, it is appreciated that actually a chain of elements 58, 44, 46, 58, 50 has to be included between PA-model 64 and model adapter 70. This has been implicitly indicated by the clock signal $F_S$ to model adapter 70.

In the description above it has been assumed that input signal to the observation receiver is taken after the power amplifier. Another possibility is to take it directly after the IQ-modulator. In such an embodiment only the IQ-modulator is compensated.

Figure 8:
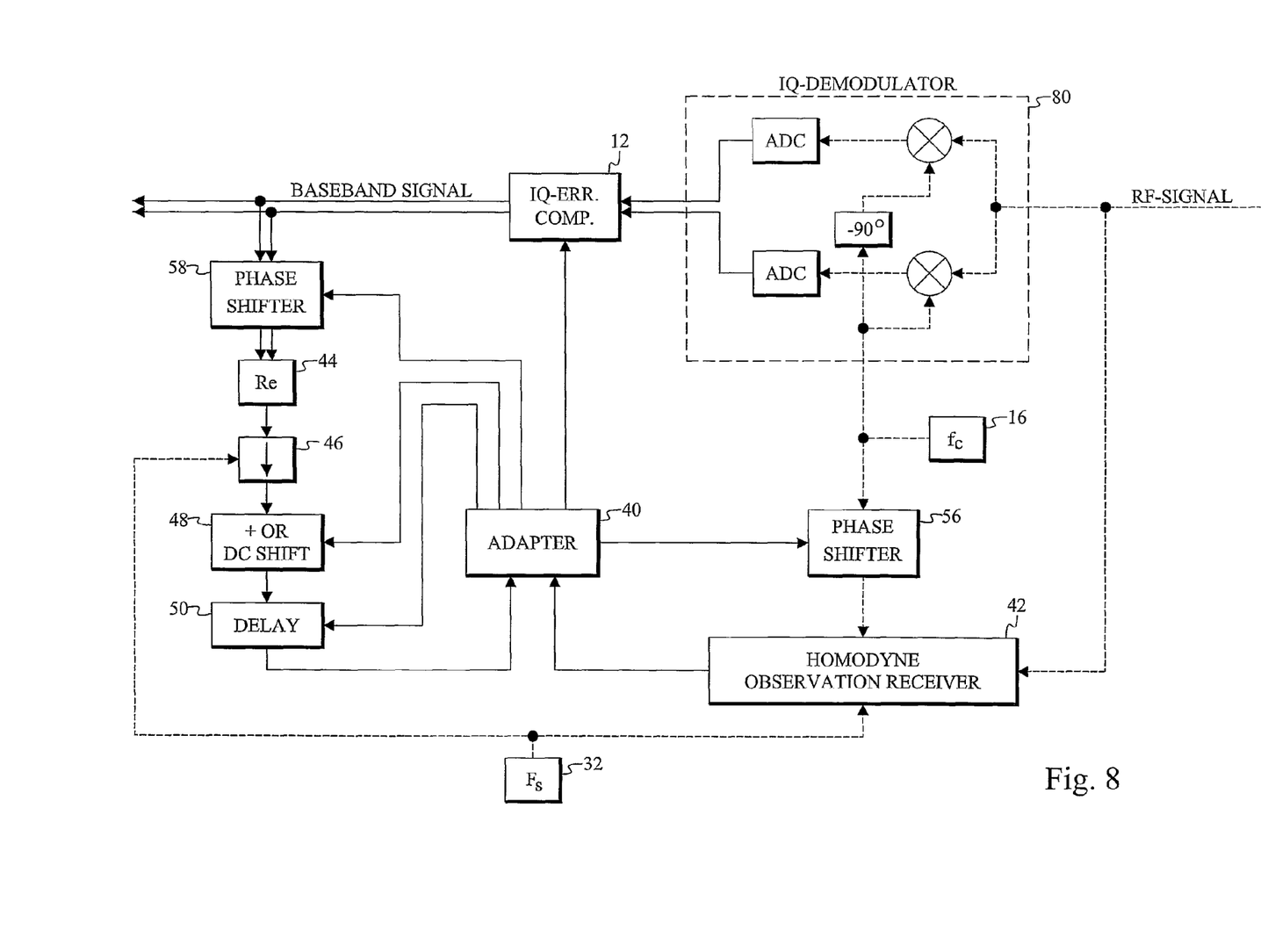
FIG. 8 is a block diagram of a first embodiment of an IQ-demodulator error compensated receiver in accordance with the present invention.
Figure 9:
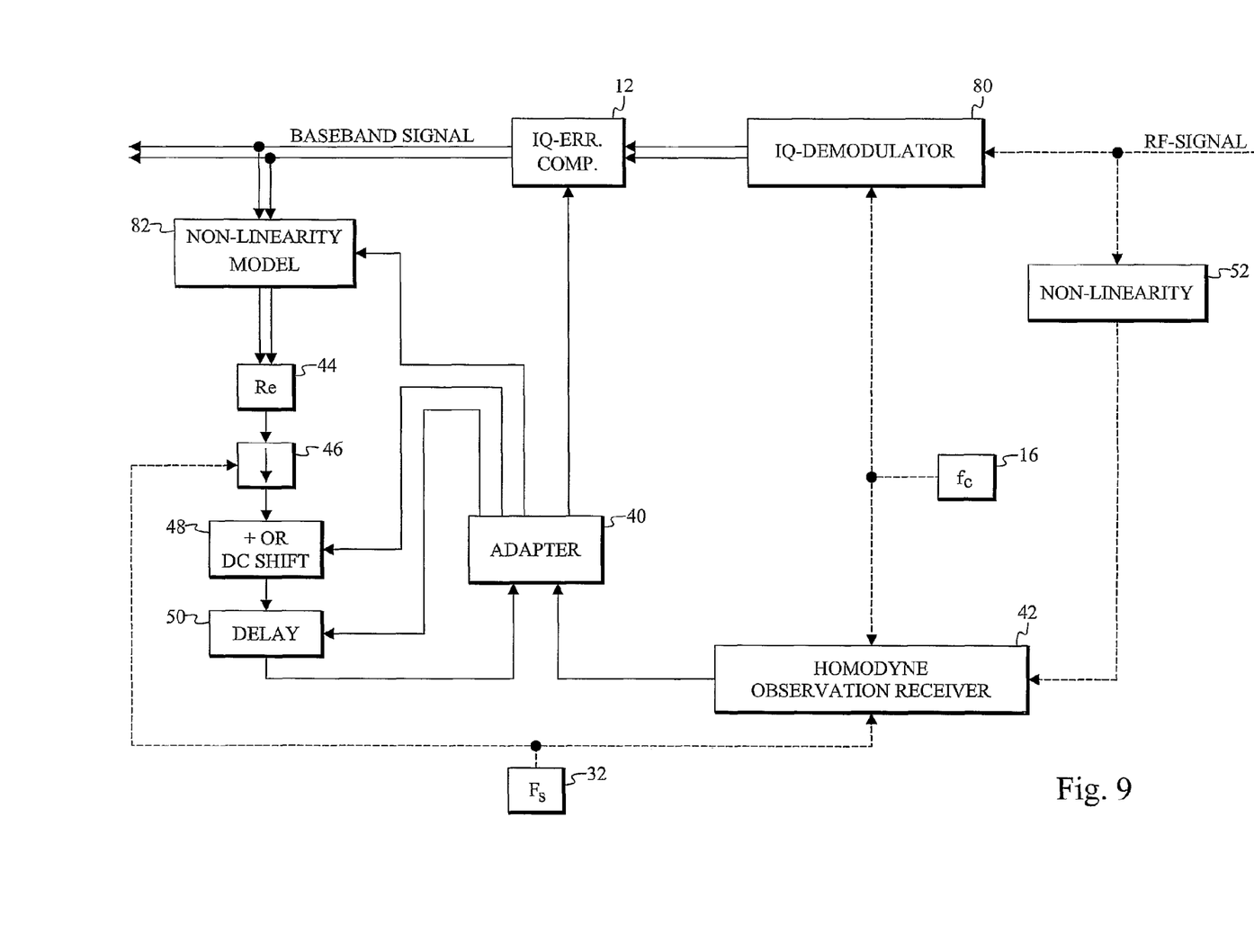
FIG. 9 is a block diagram of a second embodiment of an IQ-demodulator error compensated receiver in accordance with the present invention.

Up to this point the present invention has primarily been described with reference to a radio transmitter. However, the same principles can also be used for adaptation of the IQ-error compensator of a radio receiver. This is illustrated by the embodiments of FIGS. 8 and 9. In the embodiment of FIG. 8 an IQ-demodulator 80 and a real homodyne observation receiver 42 are both driven by the same local oscillator 16. As in the transmitter embodiment of FIG. 5, a phase shifter 56 controlled by adapter 40 is used to provide three different mixes of I/Q-components. In fact, by comparing FIG. 8 to FIG. 5 it is noted that the transmitter and receiver include essentially the same elements. The differences are that the power amplifier and its pre-distorter are not present in the receiver, that the IQ-modulator has been replaced by an IQ-demodulator and that the signal flow has been reversed. Thus, the same basic idea of the invention may be used in both a transmitter and a receiver in a very symmetrical way.

FIG. 9 is another embodiment of a receiver in accordance with the present invention. This embodiment corresponds to the transmitter embodiment of FIG. 4. A non-linear element 52 provides the information enhancing distortion. A corresponding non-linear model 82 is provided before the chain 44, 46, 48, 50 in the baseband input path to adapter 40. The digital non-linear model 82 is preferably adjusted by adapter 40 to be a true complex baseband equivalent of the analog RF non-linearity 52. Since the RF non-linearity should provide only inter-modulation distortion and not rectification and harmonics, in order to be modeled at the complex baseband, a bandpass filter is preferably inserted between the non-linearity and the observation receiver 42.

Receiver embodiments corresponding to the transmitter embodiments of FIGS. 6 and 7 are also possible. However, these are not illustrated explicitly, since their implementation based on the information given with reference to FIGS. 6 and 7 is straightforward for a person skilled in the art.

It will be understood by those skilled in the art that various modifications and changes may be made to the present invention without departure from the scope thereof, which is defined by the appended claims.

APPENDIX

```
function test
%    test of using "direct conversion" for both TX and TOR, the
%    IQ-modulator having "IQ-imbalance" ("gain imbalance and
%    phase error") and "DC-shift" (for I and .for Q) errors, the
%    TOR is mixing to real baseband and having "DC-shift" error
%
%    (optionally) a "phaseshifter" is included, to improve the
%    condition number for "low-non-linearity" PAs
%
%    the parameter values (of IQ-modulator and PA, and of
%    optionally added) additional phase-shifter) are estimated by
%    Newton's method
%    IQ-modulator parameters:
zDC=0.03-i*0.02;          %(DC-shift of IQ-modulator (complex))
alpha=0.01;       %(phase error angle (radians) of IQ-modulator),
betha=0.01;       %(amplitude un-balance angle (radians) of IQ-
                  % modulator)
iqparams= [alpha;betha;real (zDC);imag(zDC)];   %(place in vector)
%    TOR parameters:
xDC=-0.02;        %(DC-shift of TOR (real))
%    switch:include/exclude phaseshifter by out-commenting one of
%    the two following lines and keep the other,
%    phaseshifts are (zero and) the vector Vrv
Vrv=(2*pi/3)*[-1;1];        % include phaseshifter
%Vrv=[ ];        % exclude phaseshifter
NVrv=length(Vrv)
N1=128;          %(length of sample sequence)
Ainmax=1;        %(maximum _sampled_ amplitude (enough, because no
                  %memory effect))
%    PA parameters:
%(polynomial coefficients (for "PA"))
%polcofs=[1;-0.05+i*0.06;-0.04];
%polcofs=[1;-5e-2];
polcofs=1; %(use "ideal PA")
K2=length (polcofs) ;
%(very simple signal generator)
zin=(Ainmax/sqrt(2))*((rand(N1,1)-0.5)+i*(rand(N1,1)-0.5));
Dzin00=repmat (NaN,N1,0);
% run "actual" TX
zut=IQmodulator(zin,iqparams);          %("IQ-modulator")
zut=fpol1(zut,Dzin00,polcofs);          %("PA")
if     NVrv > 0;
    zut=mlphases3(zut,Dzin00,[0;Vrv]);   %("phaseshifter")
end;
xut=rhdtor1(zut,Dzin00,K2,xDC);          %("TOR")
%    initial deviation of "model" from "actual" ("error")
if     K2==3;
    polcofs1=polcofs+[0.001;0.001*i;-0.001];
elseif K2==2;
    polcofs1=polcofs+[0.001;0.001*i];
elseif K2==1;
    polcofs1=polcofs+0.001;
else;
    error (' K2>3    not yet implemented ')
end;
xDC1=xDC+1e-5;
iqparams1=iqparams+[1;2;-1;1]*1e-3;
if     NVrv > 0;
    Vrv1=Vrv+1e-3;
else;
    Vrv1=[ ];
end;
maxERROR0=max([max(abs(polcofs1-polcofs)), ...
max(abs([iqparams1-iqparams;-xDC1-xDC])), ...
max(abs(Vrv1-Vrv))])
for k111=1:3;       %(Newton iterations)
    disp(['***    iteration no. ',num2str(klll),' ***'])
    % run "model" TX
    [z1,Dz1]=IQmodulator(zin,iqparams1);
    [z1,Dz1]=fpol1(z1,Dz1,polcofs1);
    if     NVrv > 0;
        [z1,Dz1]=mlphases3(z1,Dz1,[0;Vrv1]);
        Dz1=Dz1(:,2:end);
    end;
    [xut1,Dxut1]=rhdtor1(z1,Dz1,K2,xDC1);
```

-continued

```
%   compute corrections for "model" parameter values
    if 1==2;
        % use Dxut1 directly, do not form normal matrix
        ConditionNumber=cond(Dxut1);
        disp(['ConditionNumber = ',num2str(ConditionNumber)]);
        dcv1=Dxut1\(xut-xut1);
    else;
        % do not use Dxut1 directly, form normal matrix
        NM1=Dxut1'*Dxut1;
        ConditionNumber=cond(NM1);
        disp(['ConditionNumber = ',num2str(ConditionNumber)]);
        dcv1=NM1\(Dxut1'*(xut-xut1));
    end;
    NDx=size(Dxut1,2);
    dpolcofs1=dcv1(NDx-2*K2+1:2:NDx-1)+i*dcv1(NDx-2*K2+2:2:NDx);
    diqparams1=dcv1(NDx-2*K2-3:NDx-2*K2);
    dxdc1=dcv1(1);
%   up-date "model" parameter values (but let phaseshifter wait)
    polcofs1=polcofs1+dpolcofs1;
    xDC1=xDC1+dxdc1;
    iqparams1=iqparams1+diqparams1;
%   up-date for "model" phaseshifter, if applicable
    if      NVrv > 0 ;
        dVrv1=dcv1(2:3);
        Vrv1=Vrv1+dVrv1;
    end;
%   print maximal remaining "model" parameter value error
    maxERRpc=max(abs(polcofs1-polcofs));
    maxERRiq=max(abs(iqparams1-iqparams));
    maxERRxdc=abs(xDC1-xDC);
    maxERRvrv=max(abs(Vrv1-Vrv));
    maxERROR=max([maxERRpc,maxERRiq,maxERRxdc,maxERRvrv]);
    disp(['maximal parameter value error =
', num2str(maxERROR)]);
end; %(end Newton iterations)
function [out,Dout] =IQmodulator (in, iqparams)
%    out      =   the iQ-modulator output
%    Dout     =   the derivatives of the IQ-modulator output with
%                 respect to the IQ-modulator parameters in
%                 complex input signal column vector
%    iqparams(1) = "alpha"    (phase error angle)
%    iqparams(2) = "betha"    (amplitude un-balance angle)
%    iqparams(3) = "xi"       (I carrier leakage ("DC-shift"))
%    iqparams(4) = "etha"     (Q carrier leakage ("DC-shift"))
I=real(in);
Q=imag(in);
sb=sqrt(2)*sin(iqparams(2)+pi/4);
cb=sqrt(2)*cos(iqparams(2)+pi/4);
sa=sin(iqparams(1));
ca=cos(iqparams(1));
out=sb*(ca*I+sa*Q)+iqparams(3)+i*(cb*(sa*I+ca*Q)+iqparams(4));
Dout=repmat(NaN,length(in),4);
Dout(:,1)=-sb*sa*I+sb*ca*Q+i*(cb*ca*I-cb*sa*Q);
Dout(:,2)=cb*ca*I+cb*sa*Q+i*(-sb*sa*I-sb*ca*Q);
Dout(:,3)=ones(length(in),1);
Dout(:,4)=repmat(i,length(in),1);
function [zut,Dzut]=mlphases3(zin,Dzin,Vrv,iv)
%   memoryless phaseshifter
%   zin       input signal
%   Dzin      input partial derivatives of input signal
%   Vrv       the phase-shifts
%   iv        index vector for phase-shifts, optional input
%   zut       output signal
%   Dzut      partial derivatives of output signal,
%             the derivative with respect to the phase-shift
%             is placed in column no. 1-length(Vrv), and all
%             the other derivatives shifted length(Vrv) coulumns up
NVrv=length(Vrv);
N1=length(zin);
ND1=size(Dzin,2);
if      nargin < 4;
    iv=repmat(NVrv,N1,1);
    n2=0;
    for k1=1:NVrv-1;
        n1=n2+1;
        n2=floor(k1*N1/NVrv);
        iv(n1:n2)=k1;
    end;
end;
```

```
phasevec=reshape(Vrv(iv),N1,1);
zkp=exp(i*phasevec);
zut=zkp.*zin;
Dzut=zeros(N1,ND1+NVrv);
Dzut(:,NVrv+1:ND1+NVrv)=repmat(zkp,1,ND1).*Dzin;
%Dzut(:,1)=i*zut;
for k1=1:N1;
    Dzut(k1,iv(k1))=i*zut(k1);
end;
function [xut,Dxut]=rhdtor1(zin,Dzin,K1,xDC)
%   real homodyne transmitter observation receiver,
%   model 1 (memoryless model)
xut=real(zin)+xDC;
D2=size(Dzin,2);
N1=size(zin,1);
if D2 > 0;
    D1=D2-K1;
    DD1=D1+1;
    DD2=DD1+2*K1;
    Dxut=zeros(N1,DD2);
%   derivative with respect to xDC
    Dxut(:,1)=ones(N1,1);
%   derivatives with respect to old real parameters
    Dxut(:,2:DD1)=real(Dzin(:,1:D1));
%   derivatives with respect to real part of
%   old complex parameters
    Dxut(:,DD1+1:2:DD2-1)=real(Dzin(:,D1+1:D2));
%   derivatives with respect to imaginary part of
%   old complex parameters
    Dxut(:,DD1+2:2:DD2)=-imag(Dzin(:,D1+1:D2));
else;
    Dxut=ones(N1,1);
end;
function [zut,Dzut]=fpol1(zin,Dzin,polcofs)
%   Memoryless non-linear polynomial transfer function.
%   Both value, and derivative with respect to its own
%   parameters (the polynomial coefficients) and the
%   parameters of the inputted function.
%   zin       input signal
%   Dzin      partial derivatives of input signal
%   polcofs   parameter values (polynomial coefficients)
%   zut       output signal
%   Dzout     partial derivatives of output signal,
%             the derivatives with respect to the same real
%             parameters as for derivatives in Dzin in the first
%             columns, and the derivatives with respect to the
%             complex parameters polcofs in the last columns
N1=length(zin);
K1=length(polcofs);
D1=size(Dzin,2);
D2=D1+K1;
zinas=abs(zin).^2;
zut=repmat(polcofs(K1),N1,1);
for k1=K1-1:-1:1;
    zut=zut.*zinas+repmat(polcofs(k1),N1,1);
end;
%(zut is by now "g", the large-signal gain)
DgDzin=2*(K1-1)*repmat(polcofs(K1),N1,1);
for k1=K1-1:-1:2;
    DgDzin=DgDzin.*zinas+2*(k1-1)*repmat(polcofs(k1),N1,1);
end;
DgDzin=DgDzin.*abs(zin); %(DgDzin = "d g / d |zin|")
%   derivatives of the output signal
Dzut=zeros(N1,D2);
%   derivatives with respect to parameters of input signal
% Dzut(:,1:D1)= ...
argzin=zeros(N1,1);
ii=find(abs(zin)>0);
argzin(ii)=zin(ii)./abs(zin(ii));
Dzut(1:N1,1:D1)=repmat(DgDzin.*argzin,1,D1).* ...
real(repmat(conj(zin),1,D1).*Dzin)+ ...
repmat(zut,1,D1).*Dzin;
%   derivatives with respect to the polynomial coefficients
% Dzut(:,D1+1:D2)= ...
Dzut(:,D1+1)=ones(N1,1);
for k1=2:K1;
    Dzut(:,D1+k1)=Dzut(:,D1+k1-1).*zinas;
    Dzut(:,D1+k1-1)=Dzut(:,D1+k1-1).*zin;
end;
```

-continued

```
Dzut(:,D1+K1)=Dzut(:,D1+K1).*zin;
zut=zut.*zin; %(now finally zut is "zut" (not "g"))
```

The invention claimed is:

1. A radio transmitter with IQ-modulator error compensation, comprising:
- a homodyne observation receiver producing a first real baseband signal from a real radio frequency signal;
- means for converting a complex baseband signal into a second real baseband signal;
- an adapter for determining parameters controlling an IQ-error compensator by minimizing the error between said first and second real baseband signals, wherein said adapter determines parameters of an IQ-modulator model, an inverse of the IQ-modulator model controls said IQ-error compensator; and
- means for analog signal processing of said real radio frequency signal to compensate for the fact that said homodyne observation receiver produces a real and not a complex signal.

2. The transmitter of claim 1, further comprising said analog signal processing means being implemented by a non-linear power amplifier.

3. The transmitter of claim 2, further comprising a non-linear element for enhancing the non-linearity of said power amplifier.

4. The transmitter of claim 1, further comprising a phase shifter for shifting an analog local oscillator signal to said observation receiver into three different phases.

5. The transmitter of claim 1, further comprising a model adapter determining parameters of the IQ-modulator model to determine a parameter gradient used by the first mentioned adapter to speed up adaptation.

6. A radio receiver with IQ-demodulator error compensation, comprising:
- a homodyne observation receiver producing a first real baseband signal from a real radio frequency signal;
- means for converting a complex baseband signal from an into a second real baseband signal;
- an adapter for determining parameters controlling an IQ-error compensator by minimizing the error between said first and second real baseband signals, wherein said adapter determines parameters of an IQ-demodulator model, an inverse of the IQ-modulator model controls said IQ-error compensator; and
- means for analog signal processing of said real radio frequency signal to compensate for the fact that said homodyne observation receiver produces a real and not a complex signal.

7. The receiver of claim 6, further comprising said analog signal processing means being implemented by a non-linear element.

8. The receiver of claim 6, further comprising a phase shifter for shifting an analog local oscillator signal to said observation receiver into three different phases.

9. The receiver of claim 6, further comprising a model adapter determining parameters of the IQ-modulator model to determine a parameter gradient used by the first mentioned adapter to speed up adaptation.

* * * * *

UNITED STATES PATENT AND TRADEMARK OFFICE
CERTIFICATE OF CORRECTION

PATENT NO. : 7,742,539 B2  Page 1 of 1
APPLICATION NO. : 11/568694
DATED : June 22, 2010
INVENTOR(S) : Fondén et al.

It is certified that error appears in the above-identified patent and that said Letters Patent is hereby corrected as shown below:

On the Title page, item (12), under "United States Patent", in Column 1, Line 1, delete "Fonden et al." and insert -- Fondén et al. --, therefor.

On the Title page, item (75), under "Inventors", in Column 1, Line 1, delete "Tony Fonden, Spanga" and insert -- Tony Fondén, Spånga --, therefor.

On the Title page, item (57), under "ABSTRACT", in Column 2, Line 9, delete "he" and insert -- the --, therefor.

In Column 2, Line 18, delete "invention;" and insert -- invention. --, therefor.

In Column 4, Line 54, delete "5S" and insert -- S5 --, therefor.

In Column 6, Line 16, delete "my" and insert -- may --, therefor.

In Column 7, Line 24, after "pre-distorter", insert -- 10 --.

In Column 7, Line 47, delete ""m1phases3"," and insert -- "mlphases3", --, therefor.

In Column 9, Line 64, delete "-xDC1" and insert -- xDC1 --, therefor.

In Column 9, Line 67, delete "num2str(klll)," and insert -- num2str(k111), --, therefor.

In Column 16, Line 33, in Claim 9, delete "IQ-modulator" and insert -- IQ-demodulator --, therefor.

Signed and Sealed this

Nineteenth Day of October, 2010

David J. Kappos
*Director of the United States Patent and Trademark Office*